(12) United States Patent
Shin et al.

(10) Patent No.: US 11,619,677 B2
(45) Date of Patent: Apr. 4, 2023

(54) APPARATUS AND METHOD FOR DETECTING AGING STATE OF BATTERY BASED ON HARMONIC SIGNAL

(71) Applicant: UIF (University Industry Foundation), Yonsei University, Seoul (KR)

(72) Inventors: Yong June Shin, Seoul (KR); Seon Hyeog Kim, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 17/366,902

(22) Filed: Jul. 2, 2021

(65) Prior Publication Data
US 2022/0170992 A1    Jun. 2, 2022

(30) Foreign Application Priority Data

Nov. 27, 2020  (KR) .................. 10-2020-0161962
May 12, 2021  (KR) .................. 10-2021-0061292

(51) Int. Cl.
*G01R 31/392*  (2019.01)
*H02J 7/00*  (2006.01)
*B60L 58/16*  (2019.01)

(52) U.S. Cl.
CPC ............ *G01R 31/392* (2019.01); *H02J 7/005* (2020.01); *B60L 58/16* (2019.02)

(58) Field of Classification Search
None
See application file for complete search history.

(56) References Cited

U.S. PATENT DOCUMENTS

2018/0043778 A1*  2/2018  Murbach ............... B60L 58/10
2018/0149709 A1    5/2018  Jo

FOREIGN PATENT DOCUMENTS

| KR | 10-2016-0011449 A | 2/2016 |
| KR | 10-2017-0076414 A | 7/2017 |
| KR | 10-2019-0035441 A | 4/2019 |

OTHER PUBLICATIONS

Seon Hyeog Kim et al., "Aging Monitoring Method for Lithium-Ion Batteries Using Harmonic Analysis", IEEE Transactions on Instrumentation and Measurement, Dec. 7, 2021., vol. 70.
Seon Hyeong Kim et al., "Harmonic Based Diagnostics for Aging Lithium-Ion Battery," 2019 IEEE International Symposium on Industrial Electronics, Jun. 12, 2019.

* cited by examiner

*Primary Examiner* — Jas A Sanghera (57) ABSTRACT

According to the exemplary embodiment of the present disclosure, the apparatus and the method for detecting an aging state of a battery based on a harmonic signal detect an aging state of the battery based on a harmonic signal of a pass signal of a detection signal which passes through the battery to quickly detect the aging state of the battery without separating the system during a charging and discharging cycle.

6 Claims, 9 Drawing Sheets

APPARATUS AND METHOD FOR DETECTING AGING STATE OF BATTERY BASED ON HARMONIC SIGNAL

TECHNICAL FIELD

The present disclosure relates to an apparatus and a method for detecting an aging state of a battery, and more particularly, to an apparatus and a method for detecting an aging state of a battery based on a harmonic signal.

Specifically, the present disclosure relates to an apparatus and a method which are applied to electric vehicles, hybrid vehicles or autonomous vehicles using a battery as a power source to prevent accidents in advance which may be caused by a battery discharge during the driving by monitoring an aging state of the battery in real time.

This study is related to the project of "Development of Next-Generation Grid Diagnosis and Monitoring Technology for Super Grid Implementation (No 2020R1A2B5B03001692)" project conducted under the supervision of Yonsei University with funding from the Ministry of Science and ICT of 2020-2023 with the support of the National Research Foundation of Korea and the project of "Korea-US Research Foundation New Electric Power Technology International Industry-University Cooperation Research Center (No 2017K1A4A3013579)" conducted under the supervision of Korea University with funding from the Ministry of Science and ICT of 2017-2022 with the support of the National Research Foundation of Korea.

BACKGROUND ART

Predicting lifespans of high capacity batteries which are utilized for electric vehicles or power grids and diagnosing the aging are essential to maintain a performance of a system and secure the safety. Energy storage systems (ESS) of electric vehicles (EV) and power grids use high capacity batteries in which numerous battery cells are coupled. In order to diagnose the energy storage system (ESS), many sensors need to consistently observe battery cells and store charging/discharging data. The stored data may be used to diagnose the aging state of the batteries by means of an artificial intelligence model and a state estimation algorithm.

According to a battery aging diagnosis technique of the related art, the battery is discharged to diagnose the aging state of the battery with a remaining capacity. According to an example of a precise diagnosis method, an electrochemical impedance spectroscopy (EIS) is used to observe an impedance change of the battery to estimate a state of the battery. However, according to a battery aging diagnosis technique of the related art, a SOC of the battery needs to be discharged to 0%, so that not only the lifespan of the battery is shortened, but also it takes long time to store the diagnosis data. Further, when the EIS is used, precise diagnosis is possible, but the EIS is an expensive device so that it is technically difficult to diagnose a plurality of devices including battery cells in real time. Recently, a usability expansion and real-time diagnosis technique of a high capacity battery are required.

SUMMARY OF THE INVENTION

An object to be achieved by the present disclosure is to provide an apparatus and a method for detecting an aging state of a battery based on a harmonic signal which detect an aging state of a battery based on a harmonic signal of a pass signal of a detection signal which passes through a battery.

Other and further objects of the present invention which are not specifically described can be further considered within the scope easily deduced from the following detailed description and the effect.

In order to achieve the above-mentioned object, according to an aspect of the present disclosure, a battery aging state detecting apparatus based on a harmonic signal is a battery aging state detecting apparatus which detects an aging state of a battery based on a harmonic signal including: a detection signal supplying unit which applies a detection signal to the battery; a pass signal acquiring unit which acquires a pass signal of the detection signal applied to the battery by the detection signal supplying unit which passes through the battery; and an aging state detecting unit which detects an aging state of the battery based on a harmonic signal of the pass signal acquired by the pass signal acquiring unit.

Here, the battery is located in a vehicle to be used as a power source of the vehicle and the battery aging state detecting apparatus is mounted in the vehicle to detect an aging state of the battery in a predetermined time unit.

Here, the battery aging state detecting apparatus may detect an aging state of the battery in a pause period of a charging and discharging cycle of the battery.

Here, the aging state detecting unit detects an aging state of the battery based on a harmonic signal pattern of the pass signal.

Here, the aging state detecting unit detects the aging state of the battery based on at least one of an odd-ordered harmonic signal pattern of the pass signal and an even-ordered harmonic signal pattern of the pass signal.

Here, the aging state detecting unit detects an aging state of the battery based on a harmonic signal ratio of the pass signal.

Here, the aging state detecting unit detects the aging state of the battery based on at least one of an odd-ordered harmonic signal ratio of the pass signal and an even-ordered harmonic signal ratio of the pass signal.

Here, the detection signal supplying unit applies the detection signal which is formed of a sinusoidal signal to the battery.

In order to achieve the above-mentioned object, according to another aspect of the present disclosure, a battery aging state detecting method based on a harmonic signal is a battery aging state detecting method which is performed by a battery aging state detecting apparatus which detects an aging state of a battery including applying a detection signal to the battery; acquiring a pass signal of the detection signal applied to the battery by the detection signal supplying unit which passes through the battery; and detecting an aging state of the battery based on a harmonic signal of the pass signal.

Here, the battery is located in a vehicle to be used as a power source of the vehicle and the battery aging state detecting apparatus is mounted in the vehicle to detect an aging state of the battery by performing the battery aging state detecting method in a predetermined time unit.

In the detecting of an aging state, the aging state of the battery is detected based on a harmonic signal pattern of the pass signal or a harmonic signal ratio of the pass signal.

In order to achieve the aforementioned technical object, a computer program according to the exemplary embodiment of the present disclosure is stored in a computer-readable recording medium to execute any one of the aforementioned battery aging state detecting methods based on a harmonic signal on a computer.

According to the exemplary embodiment of the present disclosure, the apparatus and the method for detecting an aging state of a battery based on a harmonic signal detect an aging state of the battery based on a harmonic signal of a pass signal of the detection signal which passes through the battery to quickly detect the aging state of the battery without separating the system during a charging and discharging cycle.

The effects of the present invention are not limited to the technical effects mentioned above, and other effects which are not mentioned can be clearly understood by those skilled in the art from the following description

DETAILED DESCRIPTION OF THE EMBODIMENT

Hereinafter, embodiments of the present invention will be described in detail with reference to the accompanying drawings. Advantages and characteristics of the present invention and a method of achieving the advantages and characteristics will be clear by referring to exemplary embodiments described below in detail together with the accompanying drawings. However, the present invention is not limited to exemplary embodiments disclosed herein but will be implemented in various different forms. The exemplary embodiments are provided by way of example only so that a person of ordinary skilled in the art can fully understand the disclosures of the present invention and the scope of the present invention. Therefore, the present invention will be defined only by the scope of the appended claims. Like reference numerals indicate like elements throughout the specification.

Unless otherwise defined, all terms (including technical and scientific terms) used in the present specification may be used as the meaning which may be commonly understood by the person with ordinary skill in the art, to which the present invention belongs. It will be further understood that terms defined in commonly used dictionaries should not be interpreted in an idealized or excessive sense unless expressly and specifically defined.

In the specification, the terms "first" or "second" are used to distinguish one component from the other component so that the scope should not be limited by these terms. For example, a first component may be referred to as a second component, and similarly, a second component may be referred to as a first component.

In the present specification, in each step, numerical symbols (for example, a, b, and c) are used for the convenience of description, but do not explain the order of the steps so that unless the context apparently indicates a specific order, the order may be different from the order described in the specification. That is, the steps may be performed in the order as described or simultaneously, or an opposite order.

In this specification, the terms "have", "may have", "include", or "may include" represent the presence of the characteristic (for example, a numerical value, a function, an operation, or a component such as a part"), but do not exclude the presence of additional characteristic.

The term "~unit" used in the specification refers to a software or hardware component such as a field programmable gate array (FPGA) or an ASIC and "~unit" performs some functions. However, "~unit" is not limited to the software or the hardware. "~unit" may be configured to be in an addressable storage medium or may be configured to reproduce one or more processors. Accordingly, as an example, "~unit" includes components such as software components, object oriented software components, class components, and task components, processes, functions, attributes, procedures, subroutines, segments of a program code, drivers, a firmware, a microcode, a circuit, data structures, and variables. A function which is provided in the components and "~units" may be combined with a smaller number of components and "~units" or further divided into additional components and "~units".

Hereinafter, exemplary embodiments of an apparatus and a method for detecting an aging state of a battery based on a harmonic signal according to the present disclosure will be described in detail with reference to the accompanying drawings.

First, a battery aging state detecting apparatus based on a harmonic signal according to an exemplary embodiment of the present disclosure will be described with reference to FIGS. 1 to 6.

Figure 1:
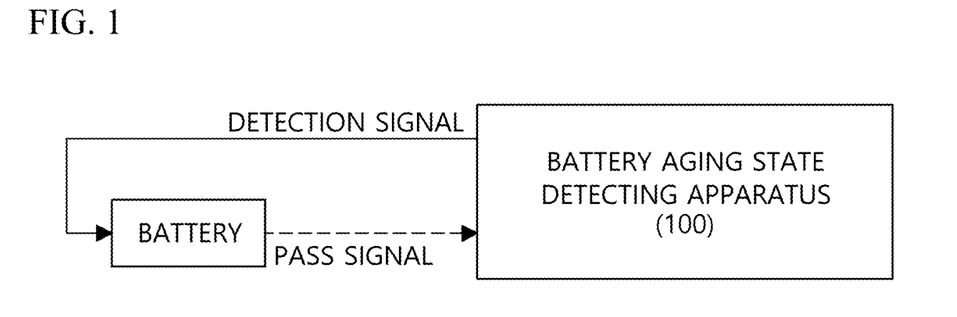
FIG. 1 is a block diagram for explaining an apparatus for detecting an aging state of a battery based on a harmonic signal according to an exemplary embodiment of the present disclosure.
Figure 2:
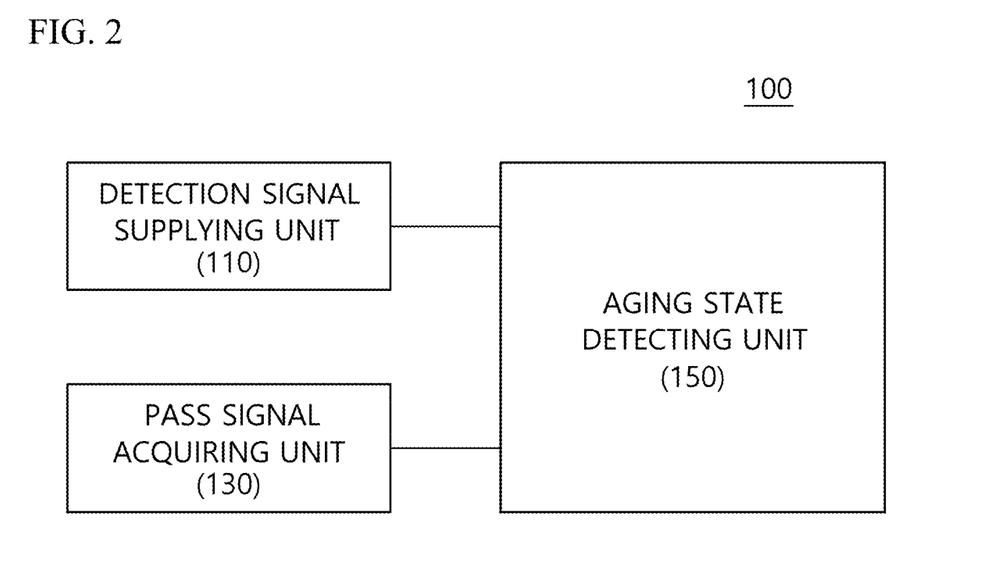
FIG. 2 is a block diagram for explaining a detailed configuration of a battery aging state detecting apparatus illustrated in FIG. 1.
Figure 3:
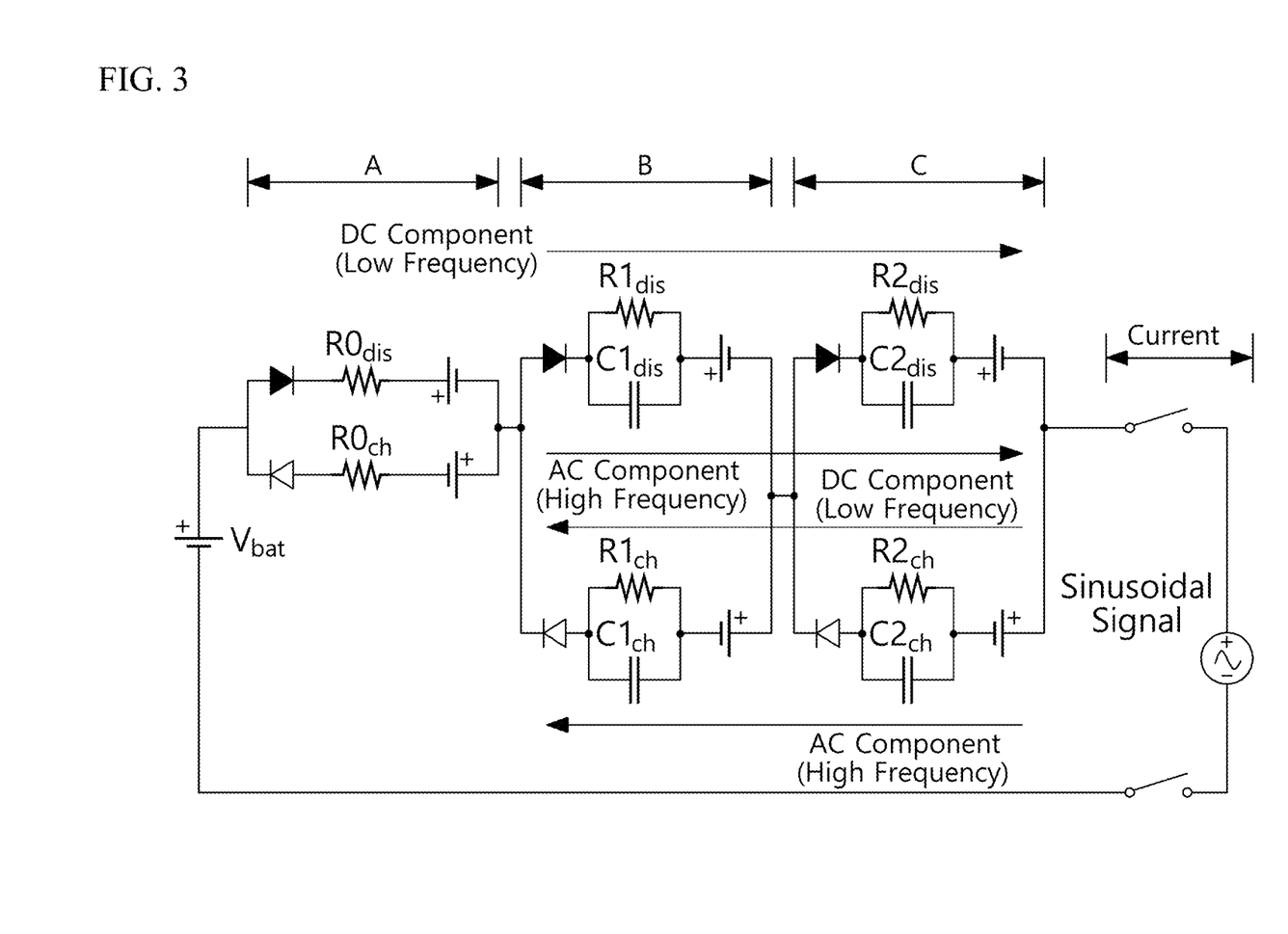
FIG. 3 is a view for explaining an example of a battery clipping circuit model according to an exemplary embodiment of the present disclosure.
Figure 4:
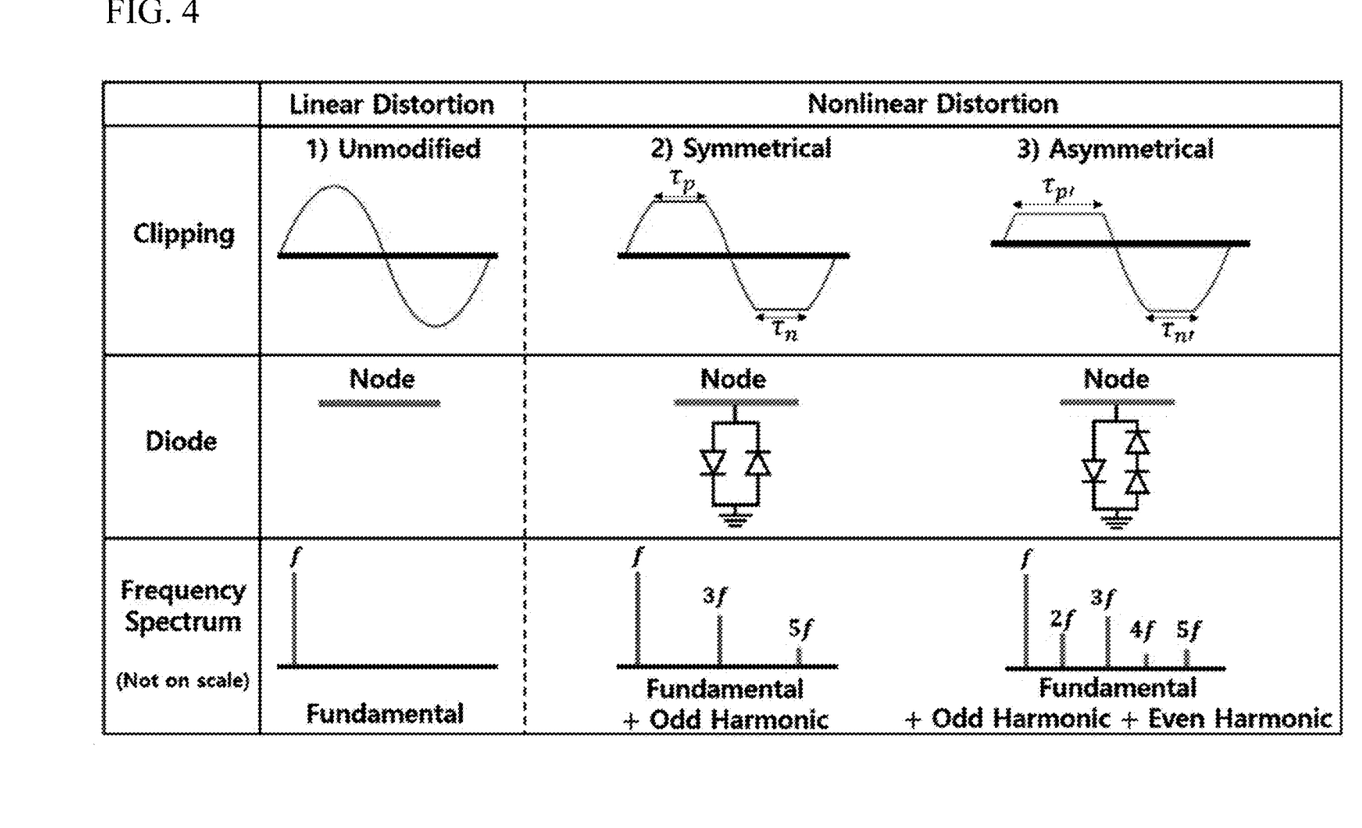
FIG. 4 is a view for explaining a distortion of a detection system according a linear/non-linear system according to an exemplary embodiment of the present disclosure.
Figure 5:
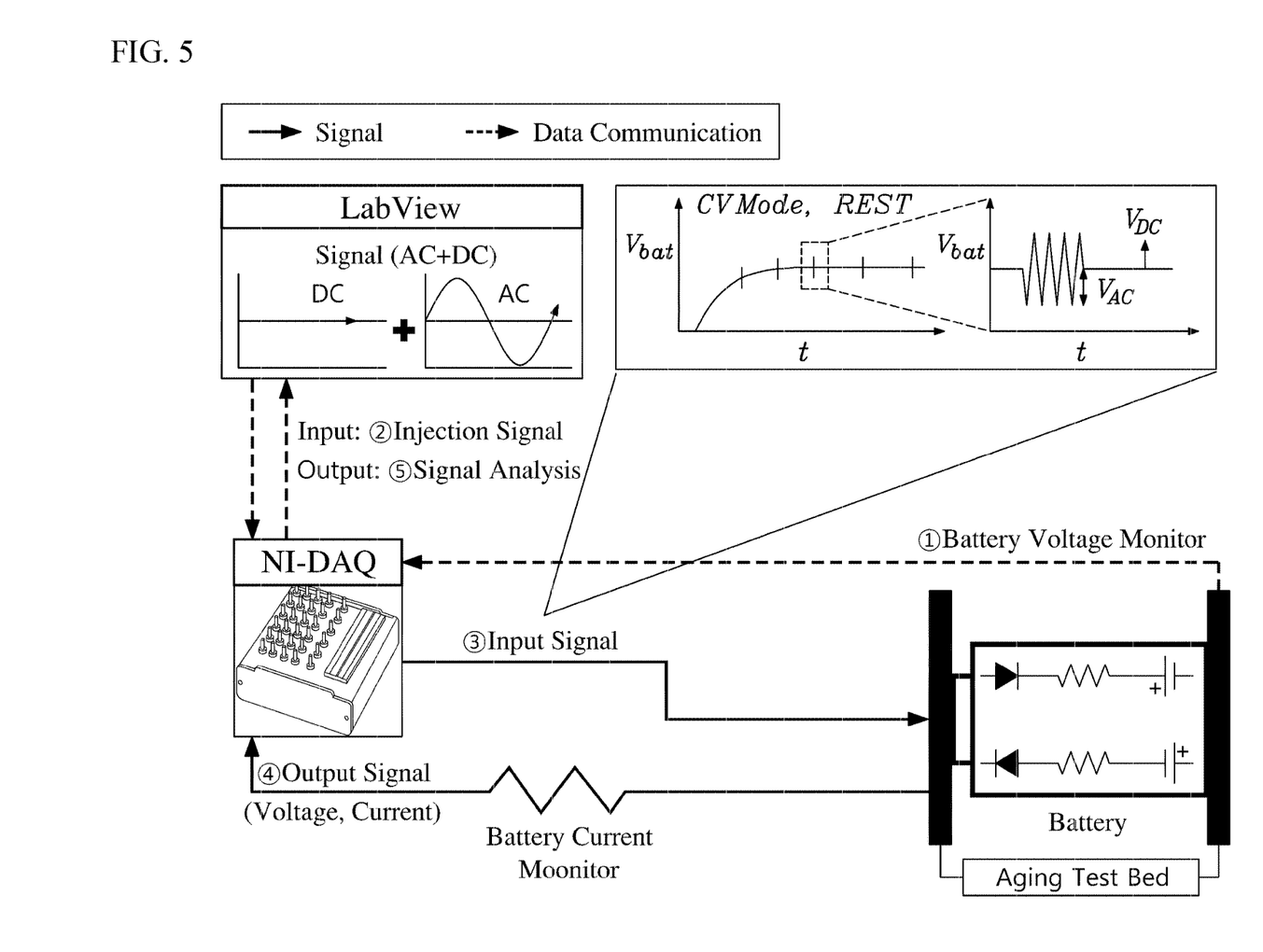
FIG. 5 is a view for explaining a design example of a battery aging state detecting apparatus according to an exemplary embodiment of the present disclosure.
Figure 6A:
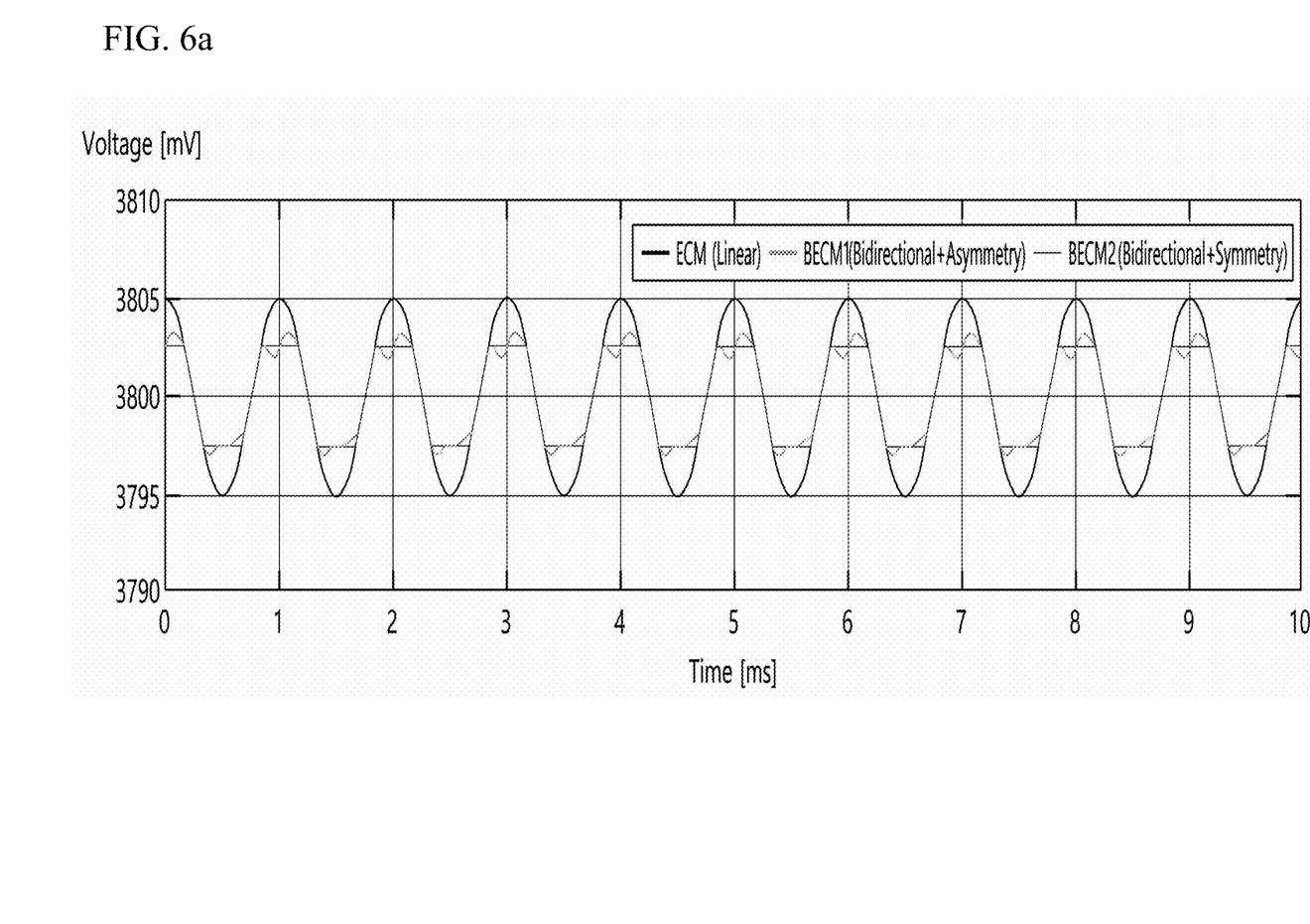
FIGS. 6a-6d are views for explaining a change in a harmonic wave in accordance with a battery aging state according to an exemplary embodiment of the present disclosure.
Figure 6B:
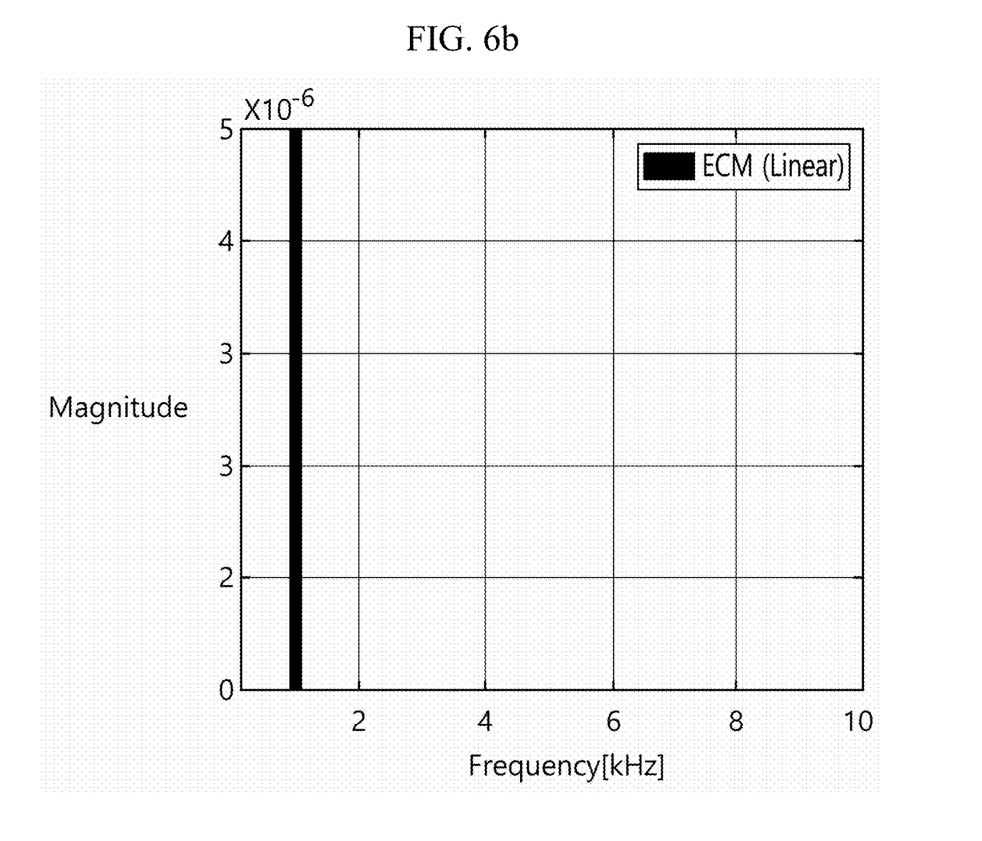
Figure 6C:
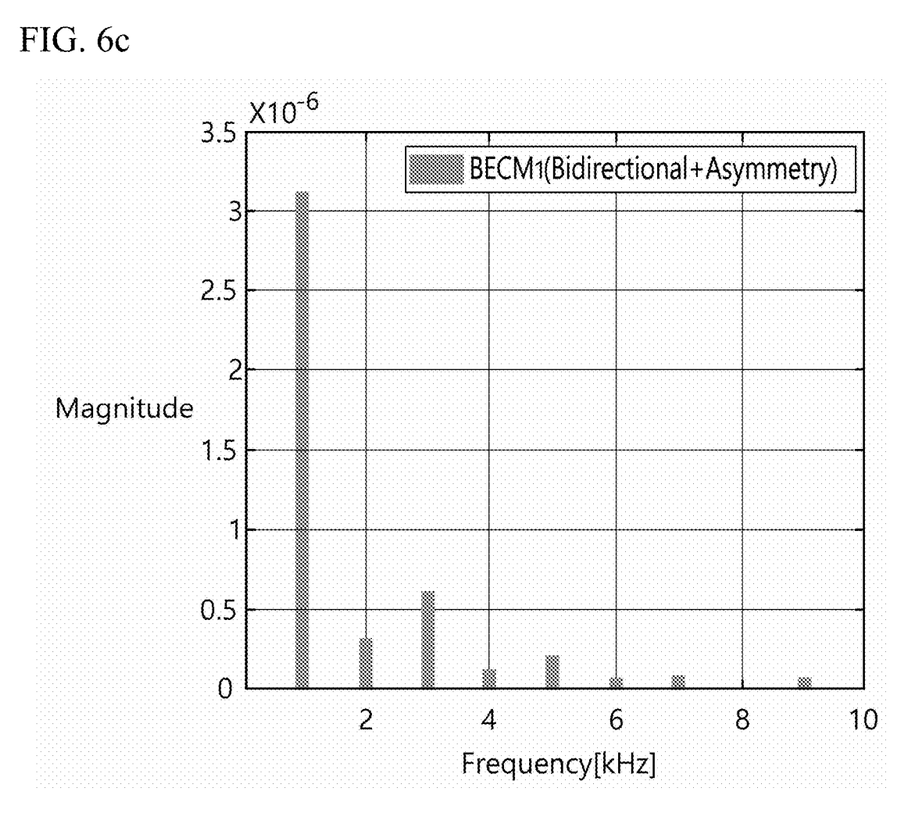
Figure 6D:
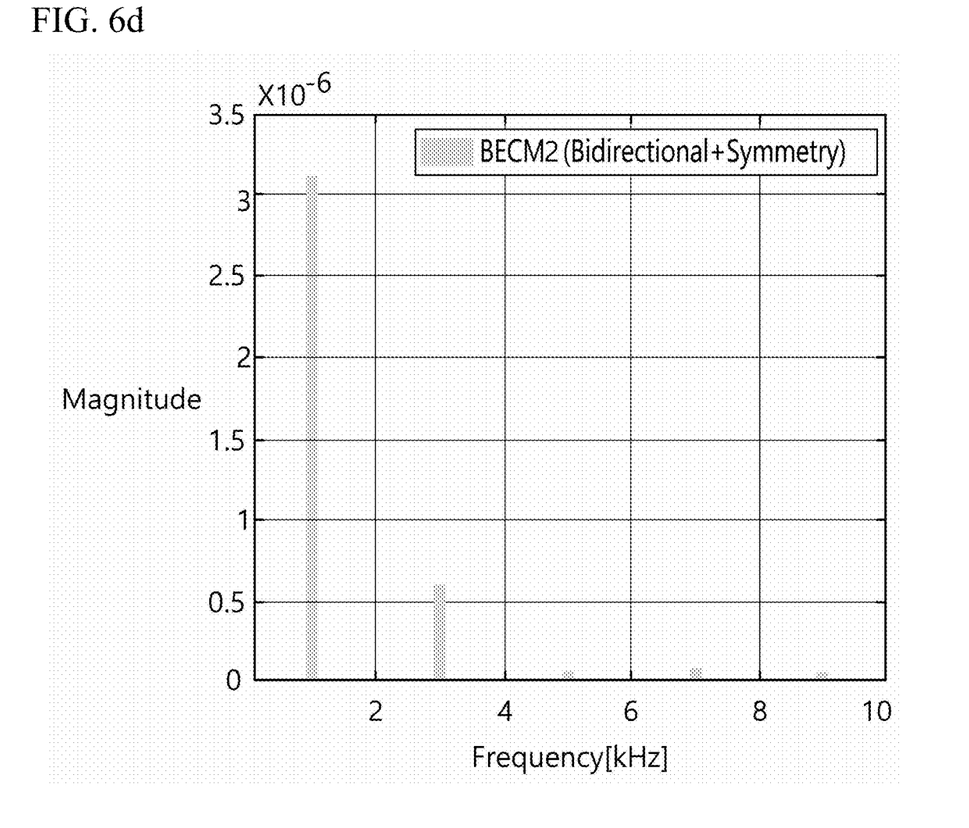

FIG. 1 is a block diagram for explaining an apparatus for detecting an aging state of a battery based on a harmonic signal according to an exemplary embodiment of the present disclosure, FIG. 2 is a block diagram for explaining a detailed configuration of an apparatus for detecting an aging state of a battery illustrated in FIG. 1, FIG. 3 is a view for explaining an example of a battery clipping circuit model according to an exemplary embodiment of the present disclosure, FIG. 4 is a view for explaining a distortion of a detection system according a linear/non-linear system according to an exemplary embodiment of the present disclosure, FIG. 5 is a view for explaining a design example of a battery aging state detecting apparatus according to an exemplary embodiment of the present disclosure, and FIG. 6 is a view for explaining a change in a harmonic wave in accordance with a battery aging state according to an exemplary embodiment of the present disclosure.

Referring to FIG. 1, an apparatus 100 for detecting an aging state of a battery based on a harmonic signal according to an exemplary embodiment of the present disclosure (hereinafter, simply referred to as a battery aging state detecting apparatus) detects an aging state of the battery based on a harmonic signal of a pass signal of a detection signal which passes through the battery.

Here, the battery is located in the vehicle (not illustrated) to be used as a power source of the vehicle. The battery aging state detecting apparatus 100 is mounted in the vehicle to detect an aging state of the battery in a predetermined time unit.

At this time, the battery aging state detecting apparatus 100 may detect the aging state of the battery during a pause period of charging and discharging cycles of the battery.

To this end, referring to FIG. 2, the battery aging state detecting apparatus 100 includes a detection signal supplying unit 110, a pass signal acquiring unit 130, and an aging state detecting unit 150.

The detection signal supplying unit 110 applies a detection signal to the battery.

That is, the detection signal supplying unit 110 applies a detection signal which is formed of a sinusoidal signal to the battery.

The pass signal acquiring unit 130 acquires a pass signal of the detection signal applied to the battery by means of the detection signal supplying unit 110 which passes through the battery.

The aging state detecting unit 150 detects the aging state of the battery based on a harmonic signal of the pass signal acquired by the pass signal acquiring unit 130.

That is, the aging state detecting unit 150 may detect the aging state of the battery based on a harmonic signal pattern of the pass signal. For example, the aging state detecting unit 150 detects the aging state of the battery based on at least one of an odd-ordered harmonic signal pattern of the pass signal and an even-ordered harmonic signal pattern of the pass signal.

Further, the aging state detecting unit 150 may detect the aging state of the battery based on a harmonic signal ratio of the pass signal. For example, the aging state detecting unit 150 detects the aging state of the battery based on at least one of an odd-ordered harmonic signal ratio of the pass signal and an even-ordered harmonic signal ratio of the pass signal.

To be more specific, a battery aging state detecting operation based on the harmonic signal according to the present disclosure is a technique of diagnosing an aging state of the battery by applying a designed signal to the battery during a charging and discharging cycle and then analyzing a distortion of the passed signal. According to the present disclosure, in a state when the batter enters a pause period of the charging and discharging cycle in the system so that the voltage is constantly maintained, the detection signal is applied to the battery. The detection signal is determined in accordance with a voltage and a state of each battery. In a new normal battery, the passed signal is distorted so that an even-ordered harmonic wave ratio is high and in the aged battery, an even-ordered harmonic wave ratio is low. By doing this, the aging state may be periodically diagnosed by means of a harmonic index without separating the battery from the system.

The battery is an energy storage device having positive and negative polarities and, as illustrated in FIG. 3, has a bidirectionality. When a voltage or a current signal is applied to the battery, a distortion of the pass signal may be caused due to the bidirectionality and a non-linearity of the battery.

As the battery is in a normal state and is healthier, the distortion of the passed signal is severe and specifically, when a sinusoidal signal is applied, a clipping phenomenon in which both peak values are cut out is observed. As illustrated in FIG. 4, in a linear system, the harmonic wave is not generated, but in a non-linear system, the harmonic wave is generated. A signal which passes the non-linear system is divided into a signal having a symmetrical distortion and a signal having an asymmetrical distortion. In both the distortion signals, peak points are cut off and the symmetrical signal mainly has odd-ordered harmonic patterns and the asymmetrical signal has even-ordered harmonic patterns.

For example, as illustrated in FIG. 5, a detection signal is applied to the battery using a DAQ device with a harmonic voltage/current signal as a detection signal and the pass signal is analyzed by Labview to monitor the harmonic pattern.

According to the battery aging state detecting operation based on a harmonic signal according to the present disclosure, an aging index of the battery may be measured within 0.02 seconds to one second without being separated from the system during the charging and discharging cycle. As illustrated in FIG. 6, a signal which passes through a normal battery is asymmetrical and includes both an odd-ordered harmonic component and an even-ordered harmonic component, but a signal which passes through an aged battery has a symmetrical distortion and mainly includes an odd-ordered harmonic component. As compared with the related art, there is no need to be completely discharge the battery, a cost for designing a system for applying a signal is more economical than EIS, and a diagnostic time is shorter. Therefore, it is easy to be applied to an algorithm and diagnostic techniques for diagnosing a plurality of battery cells.

Now, a battery aging state detecting method based on a harmonic signal according to the exemplary embodiment of the present disclosure will be described with reference to FIG. 7.

Figure 7:
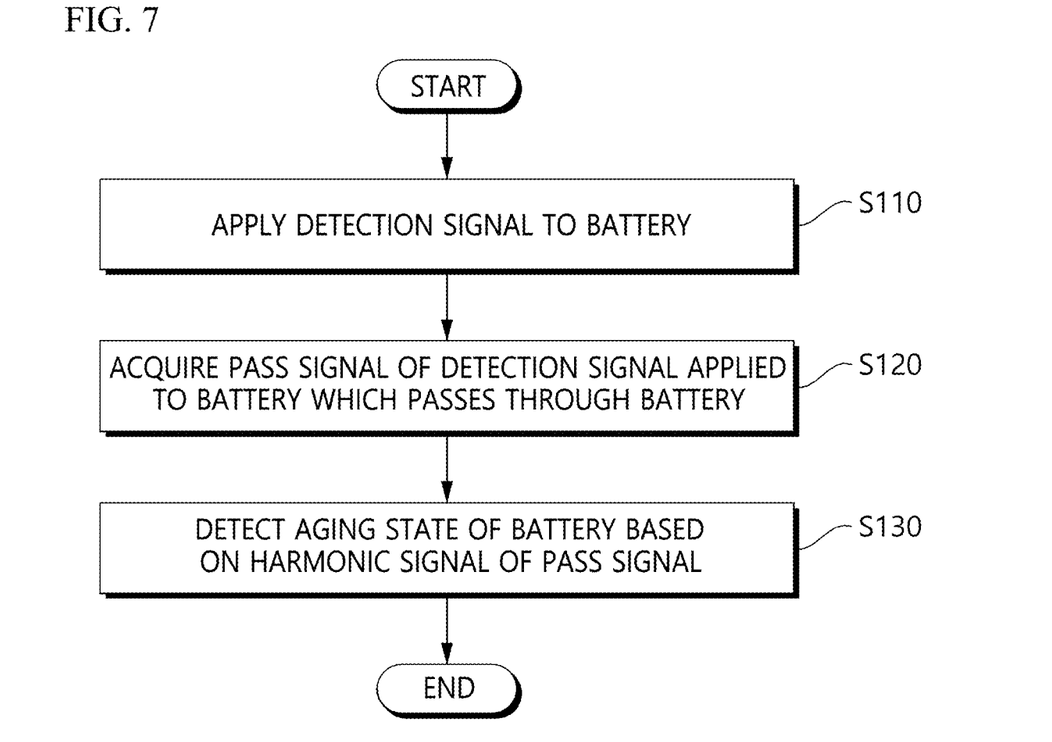
FIG. 7 is a flowchart for explaining a method for detecting an aging state of a battery based on a harmonic signal according to an exemplary embodiment of the present disclosure.

FIG. 7 is a flowchart for explaining a method for detecting an aging state of a battery based on a harmonic signal according to an exemplary embodiment of the present disclosure.

Referring to FIG. 7, the battery aging state detecting apparatus 100 applies a detection signal to a battery in step S110.

That is, the battery aging state detecting apparatus 100 applies a detection signal which is formed of a sinusoidal signal to the battery.

Next, the battery aging state detecting apparatus 100 acquires a pass signal of the detection signal applied to the battery which passes through the battery in step S120. Next, the battery aging state detecting apparatus 100 detects an aging state of the battery based on a harmonic signal of a pass signal in step S130.

That is, the battery aging state detecting apparatus 100 may detect the aging state of the battery based on a harmonic signal pattern of the pass signal. For example, the battery aging state detecting apparatus 100 detects the aging state of the battery based on at least one of an odd-ordered harmonic signal pattern of the pass signal and an even-ordered harmonic signal pattern of the pass signal.

Further, the battery aging state detecting apparatus 100 may detect the aging state of the battery based on a harmonic signal ratio of the pass signal. For example, the battery aging state detecting apparatus 100 detects the aging state of the battery based on at least one of an odd-ordered harmonic signal ratio of the pass signal and an even-ordered harmonic signal ratio of the pass signal.

Even though it has been described above that all components of the exemplary embodiment of the present invention are combined as one component or operate to be combined, the present invention is not limited to the exemplary embodiment. In other words, one or more components may be selectively combined to be operated within a scope of the present invention. Further, all components may be implemented as one independent hardware but a part or all of the components are selectively combined to be implemented as a computer program which includes a program module which performs a part or all functions combined in one or plural hardware. Further, such a computer program may be stored in a computer readable media such as a USB memory, a CD disk, or a flash memory to be read and executed by a computer to implement the exemplary embodiment of the present invention. The recording media of the computer program may include a magnetic recording medium or an optical recording medium.

The above description illustrates a technical spirit of the present invention as an example and various changes, modifications, and substitutions become apparent to those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit of the present invention is not limited by the exemplary embodiments and accompanying drawings. The protection scope of the present invention should be interpreted based on the following appended claims and it should be appreciated that all technical spirits included within a range equivalent thereto are included in the protection scope of the present invention.

What is claimed is:

1. A battery aging state detecting apparatus which detects an aging state of a battery based on a harmonic signal, the apparatus comprising:
   a detection signal supplying unit which applies a detection signal to the battery;
   a pass signal acquiring unit which acquires a pass signal of the detection signal applied to the battery by the detection signal supplying unit which passes through the battery; and
   an aging state detecting unit which detects the aging state of the battery based on an even-ordered harmonic signal ratio of the pass signal acquired by the pass signal acquiring unit,
   wherein the aging state of the battery is detected in a pause period of a charging and discharging cycle of the battery.

2. The battery aging state detecting apparatus according to claim 1, wherein the battery is located in a vehicle to be used as a power source of the vehicle and the battery aging state detecting apparatus is mounted in the vehicle to detect an aging state of the battery in a predetermined time unit.

3. The battery aging state detecting apparatus according to claim 2, wherein the detection signal supplying unit applies the detection signal which is formed of a sinusoidal signal to the battery.

4. A harmonic signal based battery aging state detecting method which is performed by a battery aging state detecting apparatus which detects an aging state of a battery, the method comprising:
   applying a detection signal to a battery;
   acquiring a pass signal of the detection signal applied to the battery which passes through the battery; and
   detecting the aging state of the battery based on an even-ordered harmonic signal ratio,
   wherein the aging state of the battery is detected in a pause period of a charging and discharging cycle of the battery.

5. The battery aging state detecting method according to claim 4, wherein the battery is located in a vehicle to be used as a power source of the vehicle and the battery aging state detecting apparatus is mounted in the vehicle to detect an aging state of the battery by performing the battery aging state detecting method in a predetermined time unit.

6. A non-transitory computer readable storage medium comprising a computer program to execute the battery aging state detecting method according to claim 4.

* * * * *